(12) United States Patent
Khandelwal et al.

(10) Patent No.: US 9,362,755 B2
(45) Date of Patent: *Jun. 7, 2016

(54) CIRCUIT AND ARCHITECTURE FOR A DEMODULATOR FOR A WIRELESS POWER TRANSFER SYSTEM AND METHOD THEREFOR

(71) Applicant: Texas Instruments Incorporated, Dallas, TX (US)

(72) Inventors: Ashish Khandelwal, Irving, TX (US); Joseph M. Khayat, Bedford, NH (US); Yipeng Su, Blacksburg, VA (US); Robert A. Neidorff, Bedford, NH (US); Bharath B. Kannan, Merimack, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/502,048

(22) Filed: Sep. 30, 2014

(65) Prior Publication Data

US 2015/0171935 A1 Jun. 18, 2015

Related U.S. Application Data

(60) Provisional application No. 61/916,655, filed on Dec. 16, 2013, provisional application No. 61/916,643, filed on Dec. 16, 2013, provisional application No. 61/916,669, filed on Dec. 16, 2013.

(51) Int. Cl.
*H04B 5/00* (2006.01)
*H02J 5/00* (2016.01)
*H03K 19/20* (2006.01)

(Continued)

(52) U.S. Cl.
CPC ............... *H02J 5/005* (2013.01); *H02J 7/025* (2013.01); *H03K 19/20* (2013.01); *H04B 5/0093* (2013.01); *H04B 5/02* (2013.01); *H04B 5/0031* (2013.01); *H04B 5/0037* (2013.01)

(58) Field of Classification Search
USPC ........... 455/41.1; 340/10.1, 10.3, 10.34, 10.4, 340/13.24, 13.25, 13.26
See application file for complete search history.

(56) References Cited

U.S. PATENT DOCUMENTS

| | | | | |
|---|---|---|---|---|
| 5,504,485 A | * | 4/1996 | Landt .................... | G06K 7/0008 342/42 |
| 8,179,088 B2 | * | 5/2012 | Takaishi ............... | G06K 7/0008 320/107 |
| 8,669,678 B2 | * | 3/2014 | Urano ..................... | H02J 5/005 307/104 |

(Continued)

*Primary Examiner* — Tuan A Tran
(74) *Attorney, Agent, or Firm* — William B. Kempler; Frank D. Cimino (57) ABSTRACT

A primary side wireless power transmitter inductively couplable to a secondary side wireless power receiver for supplying power to the wireless power receiver for receiving communications from the secondary side wireless power receiver through the inductive coupling comprises a primary side tank circuit receiving a signal on from the secondary side wireless power receiver. A phase delay or time delay circuit generates a fixed delay clock signal. A sample and hold circuit samples a tank circuit voltage utilizing the fixed phase or time delayed clock signal. A comparator is coupled to an output of the sample and hold circuit for extracting data or commands from the signal stream. A method of operating a primary side wireless transmitter inductively coupled to a secondary side wireless power receiver for supplying power to the wireless power receiver to power a load coupled to the receiver is also disclosed.

24 Claims, 7 Drawing Sheets

(51) Int. Cl.
*H04B 5/02* (2006.01)
*H02J 7/02* (2016.01)

(56) References Cited

U.S. PATENT DOCUMENTS

| | | | | |
|---|---|---|---|---|
| 9,041,254 B2* | 5/2015 | Lisuwandi | ............... | H02J 5/005 307/104 |
| 9,112,364 B2* | 8/2015 | Partovi | ................... | H02J 7/025 |
| 2012/0212068 A1* | 8/2012 | Urano | ................... | H02J 5/005 307/104 |
| 2013/0154373 A1* | 6/2013 | Lisuwandi | ............... | H02J 5/005 307/34 |
| 2014/0106826 A1* | 4/2014 | Yeo | ........................ | H02J 5/005 455/573 |
| 2014/0191568 A1* | 7/2014 | Partovi | ................... | H02J 7/025 307/9.1 |
| 2014/0368050 A1* | 12/2014 | Chun | ................... | H04B 5/0037 307/104 |
| 2015/0108847 A1* | 4/2015 | Taylor | ................. | H04B 5/0037 307/104 |

* cited by examiner

CIRCUIT AND ARCHITECTURE FOR A DEMODULATOR FOR A WIRELESS POWER TRANSFER SYSTEM AND METHOD THEREFOR

CROSS-REFERENCE TO RELATED APPLICATIONS

This patent application claims priority from U.S. Provisional Application No. 61/916,655, filed Dec. 16, 2013; U.S. Provisional Application No. 61/916,643, filed Dec. 16, 2013; and U.S. Provisional Application No. 61/916,669 filed Dec. 16, 2013, which are incorporated herein by reference in their entirety for all purposes. This application is related to U.S. application Ser. No. 14/501,850; U.S. application Ser. No. 14/502,378; and U.S. application Ser. No. 14/502,285, filed on even date, which are incorporated herein by reference in their entirety for all purposes.

FIELD

The invention relates to recovery of data or commands in a signal stream received from a wireless power receiver in a wireless power transmitter.

BACKGROUND

The explosion of small portable electronic devices such as cell phones has led to the desire to be able to recharge the device without the necessity of attaching a cord to the device. A solution that accomplishes this task is known as "wireless power". The term "wireless power" as utilized herein refers to the transmission of electrical energy from a power source to an electrical load without interconnecting wires. A common form for wireless power transmission utilizes two electromagnetically coupled coils to form a transformer through which power is transferred from the primary side to the receiving side. The transmitter may take the form of a pad having a coil embedded therein. The receiver may be built into a cellular telephone, for example, with the receiving side coil built into the back thereof. Although there is no direct contact between the transmitting and receiving coils, the close proximity of the coils and the judicious use of shielding allows for efficient transfer of energy from the transmitting side to the receiving side to operate a load, which may be a rechargeable battery being recharged by the system, for example.

Figure 1:
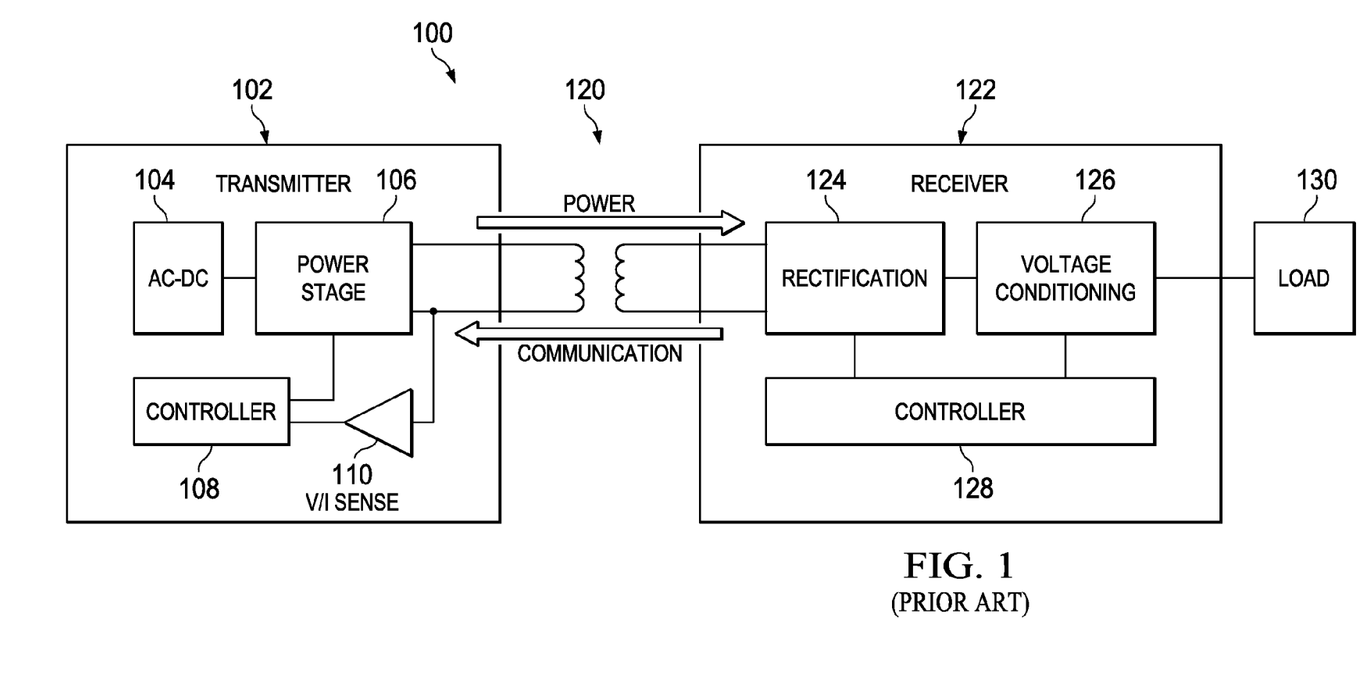
FIG. 1 is a diagram of a wireless power system according to the prior art.

FIG. 1 shows a block diagram of a prior art wireless power transmission system, generally as 100. The system comprises a transmitter side 102 and a receiver side 122. The transmitter side 102 comprises a circuit 104 for rectifying an AC input into a DC voltage which is fed into a power stage 106 for generating a high frequency signal. The high-frequency signal is coupled across a transformer 120 to the receiver side 122. The power stage 106 is controlled by controller 108 which could be combined into a single integrated circuit with the power stage 106. The receiver side 122 comprises a rectifier circuit 124 to output a DC voltage and a voltage conditioning circuit 126 which is operated by the receiver controller 128 to supply power to a load 130, which may be a rechargeable battery being recharged by the system, for example.

As shown FIG. 1, power flows from left to right from the transmitter to the receiver and communications flows from right to left from the receiver to the transmitter. The communication signals may be command signals to adjust the power level from the transmitter or other parameters, for example. The communication signals may be generated by coupling a resistor or capacitor across the receiving coil to generate signals which can be recognized by the controller on the transmitting side. The low-level signals are noisy because of the noise generated by the power transmission portion of the system.

The Wireless Power Consortium (WPC) defines a standard for such wireless power transmission. In a WPC defined wireless charging system, the power transmitter detects the signal from the power receiver as a modulation of current through and/or voltage across the primary circuit through a V/I circuit 110. In other words, the power receiver and the power transmitter use amplitude modulated power signals to provide a power receiver to power transmitter communication channel.

The WPC defined communication channel assumes that the incoming power signal is always amplitude modulated. However, that may not be a valid assumption. Accordingly, there is a need for a reliable, low-cost and easily integratable solution for detecting information being sent from the receiver to the transmitter in a wireless power system.

SUMMARY

It is a general object of the invention to provide for recovery of data or commands in a signal stream in a wireless power transmitter.

In an aspect, in a primary side wireless power transmitter for being inductively coupled to a secondary side wireless power receiver for supplying power to the wireless power receiver to power a load coupled to the wireless power receiver, a primary side control for receiving communications from the secondary side wireless power receiver through the inductive coupling comprises a primary side tank circuit receiving a signal from the secondary side wireless power receiver. A phase delay circuit generates a fixed phase delay clock signal. A sample and hold circuit samples a tank circuit voltage utilizing the fixed phase delayed clock signal. A comparator is coupled to an output of the sample and hold circuit for extracting data or commands from the signal stream.

In an aspect, a method of operating a primary side wireless transmitter inductively coupled to a secondary side wireless power receiver for supplying power to the wireless power receiver to power a load coupled to the receiver comprises receiving a signal stream from the wireless power receiver in a primary side tank circuit. A fixed phase delay clock signal is generated. The tank circuit voltage is sampled utilizing the fixed phase delayed clock in holding the sample value. A threshold voltage signal is generated from the signal stream signal. Data is extracted from the signal stream utilizing the threshold voltage signal.

BRIEF DESCRIPTION OF DRAWINGS

Further aspects of the invention will appear from the appending claims and from the following detailed description given with reference to the appending drawings.

DETAILED DESCRIPTION

In order to have a reliable communication channel, the system must tolerate system parameter variations including variations in the coupling coefficient (K) of between 0.2 and 0.7, and variation in the receiver load from 5 ohms to 1 kilo ohm, transmit and receive coil inductance variation due to shielding, effects of the battery effects of a magnet used to center the receiving device on the transmitting pad and manufacturing tolerances over the entire range of operating frequency from 110 kHz to 205 kHz.

The WPC defined communication channel assumes that the incoming signal is always amplitude modulated. However, the present inventors have discovered that this information may be lost because of its low value (i.e. 200 mV) which may be further reduced when the power signal level (which can be 70 Vpp) is divided down to a voltage level that can be handled by an integrated circuit, as this signal, which rides on the power signal, will also be reduced. This low level signal can be masked by changes in the load current. Accordingly, the inventors have determined that the signal data may lie within the phase of incoming carrier signal, rather than the amplitude. Therefore, a traditional amplitude demodulator channel is inadequate to solve the problems described above.

Figure 2:
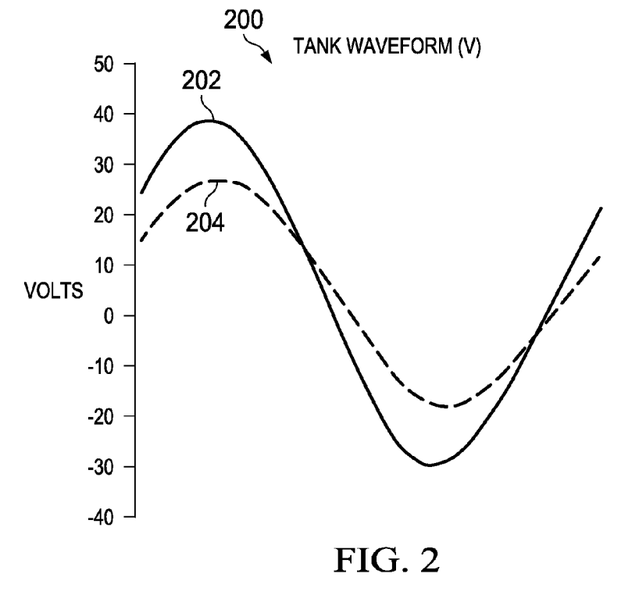
FIG. 2 is a graph showing the tank waveform in a wireless power system.

FIG. 2 shows the tank signal waveform of the power transmitter where data is being sent from the receiver to the transmitter, generally as 200. In FIG. 2, the load resistance is 100 ohms, the coefficient of coupling K is 0.7, the secondary (receiver) side capacitor, utilized to transmit data or commands back to the transmitter (primary) side, is 22 nF. The primary side inductance is 9.36 µH and the secondary side inductance is 16 µH with the circuit having an operating frequency of 155 kHz. Waveform 202 is without the capacitor being coupled across the secondary side of receiver coil and the waveform 204 shows the same signal with the capacitor coupled across the secondary side receive coil to transmit information. Under these circumstances, there is a difference in amplitude between the two waveforms and the information in the signal can be amplitude detected.

Figure 3:
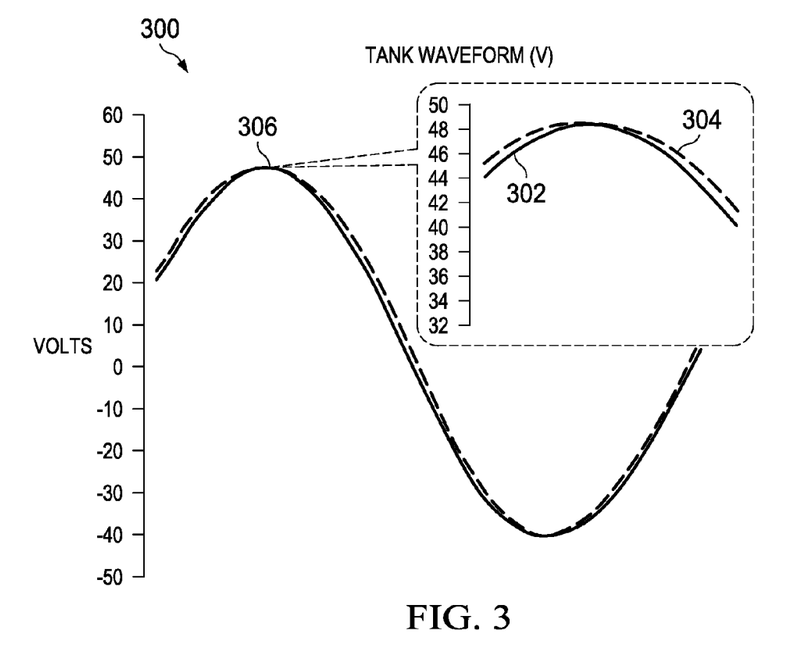
FIG. 3 is a graph showing the tank waveform in which the two signals in a wireless power system have the same amplitude.

FIG. 3 shows the tank signal waveform of a power transmitter generally as 300. In FIG. 3, the load resistance is 5 ohms, the coupling coefficient is 0.2, the capacitance is 22 nF, the primary side inductor is 9.36 µH, the secondary side inductor is 16 µH and the operating frequency is 155 kHz. As can be seen, the peaks of the waveforms with and without capacitance being switched in at the secondary side, are identical at 306. The exploded view shows the signal 302 which is the signal without the capacitor being switched in across the receiver side coil and the signal 304 which shows the capacitor switched in across the coil. Therefore, it may be very difficult to detect the data when the signal peaks are essentially identical utilizing amplitude demodulation.

Figure 4:
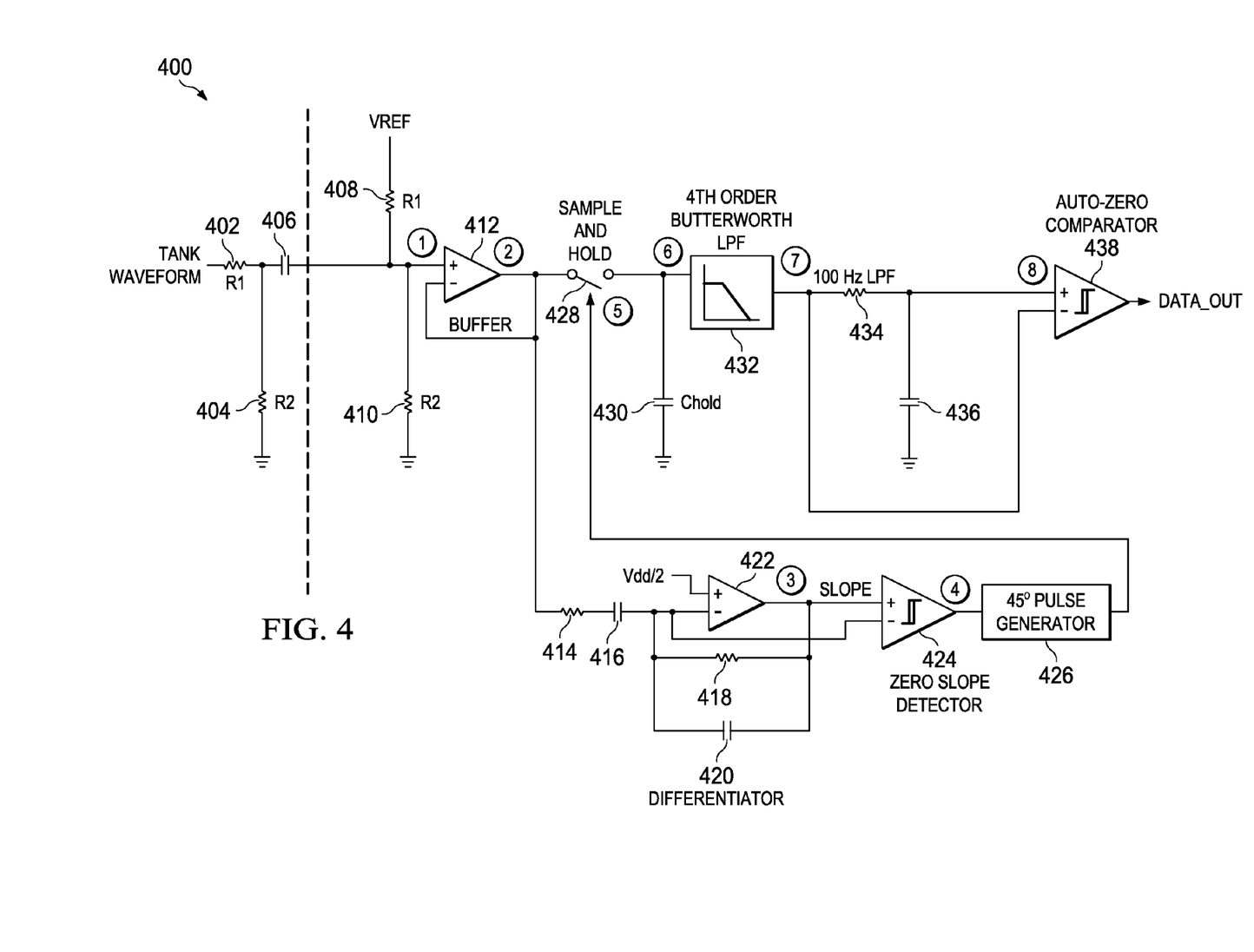
FIG. 4 is a block diagram of an embodiment constructed according to the principles of the present disclosure.

FIG. 4 shows an embodiment of a solution to this problem generally as 400. In FIG. 4, the tank waveform from the transmitter side tank circuit is coupled via resistor divider 402, 404 to a capacitor 406. The resistor divider 402, 404 divides of the voltage across the tank circuit, which may be as much as 70 V peak to peak, to a voltage level that can be handled by an integrated circuit. Capacitor 406 blocks the DC level of the input waveform from affecting the setpoint of a buffer circuit 412, the non-inverting input of which is coupled to the capacitor 406. This allows the setpoint of the buffer 412 to be set via the resistor divider 408, 410 between a reference voltage and ground. The inventors have found it to be advantageous to utilize the voltage just slightly above 0 V, for example, 100 or 200 mV as the setpoint for the buffer 412. In addition, the circuit may be operated at a higher voltage than may be used for other portions of the transmitter circuit, for example 4 V rather than 3.3 V. The combination of these two features allows for an increased voltage swing of the measured data or commands in the signal stream. Buffer 412 has its output coupled to the inverting input thereof so that it has a gain of unity. The output of buffer 412 is coupled to a differentiator circuit 414, 416, 418, 420 and 422. The amplifier 422 has its inverting input coupled to the output of the buffer 412 via resistor 414 and coupling capacitor 416, which are coupled in series. The amplifier 422 has its output coupled to the inverting input with the parallel combination of resistor 418 and capacitor 420. Placing a small value capacitor such as capacitor 420 across the feedback resistor 418 and placing a resistor in series with the input, such as resistor 414, increases the stability of the differentiator circuit. The non-inverting input to amplifier 422 is coupled to half the supply voltage as a reference for maximizing the dynamic range of the input and output signals. The output of amplifier 422 is coupled to the non-inverting input of a zero slope detector 424. The inverting input of slope detector 424 is coupled to the inverting input of amplifier 422. The output of amplifier 424 is coupled to an input of a 45° delayed pulse generator 426, which generates a 45° delay. The output of 45° delayed pulse generator 426 operates the switch 428 of sample hold circuit 428, 430. It should be noted that the phase delay can range at least between 15° and 75° without departing from the principles of the present disclosure.

A sample value is stored in capacitor 430 which is coupled between the switch and ground. The voltage across capacitor 430 is filtered by a low pass filter 432, here in a fifth order Butterworth low pass filter. The output of the low pass filter 432 is connected to the inverting input of a low-offset or auto-zero comparator 438. The output of the low pass filter 432 is also coupled through RC filter 434, 436 to the non-inverting input of auto-zero comparator 438. The resistor 434 is coupled in series between the output of low pass filter 432 and the non-inverting input of auto zero comparator 438. The capacitor is connected between the non-inverting input of the auto-zero comparator 438 and ground. The output of auto zero comparator 438 is the data or command signal.

In operation, the coil voltage from the transmit coil in the transmit tank circuit can be sensed directly. This voltage, which can be as high as 70 V peak to peak the varying DC level, is AC coupled to the demodulator signal chain through a resistor divider 402, 404 which reduces the voltage to level it can be handled by an integrated circuit. Depending upon the voltage reduction of the resistor divider 402, 404, the signal to be detected can be 100 mV or lower riding on top of the 10-70 V peak to peak carrier amplitude. Thus it has a very low signal-to-noise ratio (SNR). In addition, the carrier has both positive and negative swings with respect to ground. Therefore, the present invention maximizes the signal amplitude by setting the DC setpoint at the input of amplifier 412 very close to ground, for example 200 mV. This, along with a higher voltage (for example for 4 V) supply for the amplifier 412 allows for a signal swing of almost 4 V.

Figure 6:
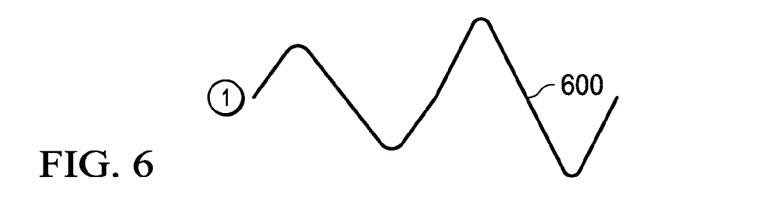
FIGS. 6-13 show waveforms for the circuits illustrated in FIGS. 4 and 5.

The input voltage to the non-inverting terminal of buffer amplifier 412 is shown in FIG. 6, generally as 600. As can be seen, it is an amplitude (or phase) modulated sine wave of frequency between 110 kHz-205 kHz. The amplitude modulation frequency is 2 kHz. The 600 shows two periods; one just before the modulation and one after the modulation.

Figure 7:
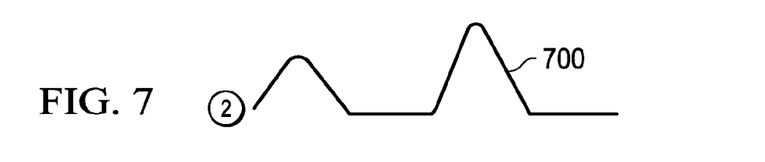
Figure 8:
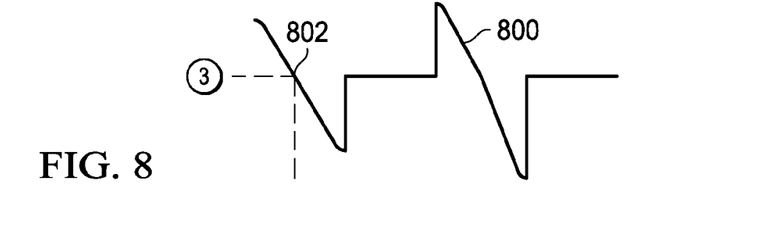
Figure 9:
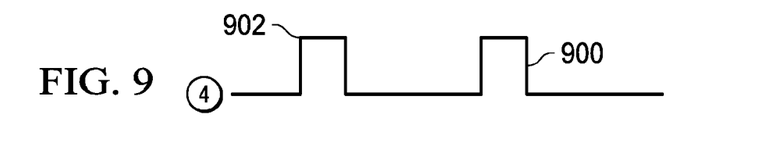
Figure 10:
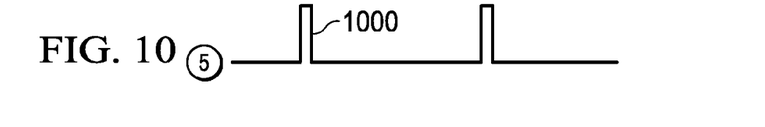

The output of buffer amplifier 412 is shown in FIG. 7 as a half wave rectified sine wave 700. The output of buffer amplifier 412 is coupled to differentiator circuit 414, 416, 418, 420, 422 which converts the sine wave input (signal 700) into a cosine wave signal 800 shown in FIG. 8. The zero crossing of waveform 800, at 802 in FIG. 8 is detected by zero slope detector 424 which generates an output pulse 900 shown in FIG. 9. The rising edge 902 of pulse 900 corresponds to the zero crossing 802 of signal 800. Pulse 900 is coupled to 45° delayed pulse generator 426 which generates a signal 1000 which is delayed by 45° from the rising edge 902 of signal 900. The inventors have discovered through extensive simulations and analysis that the incoming carrier will have sufficient modulation depth if samples taken between 40° and 50° with respect to the peak are utilized. The signal 1000 is used to operate switch 428 of sample hold circuit 428, 432 to store a sample at the 45° delay point from the tank circuit peak voltage on capacitor 430.

Figure 11:
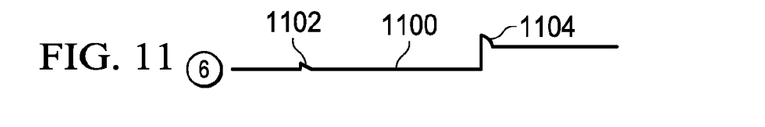
Figure 12:
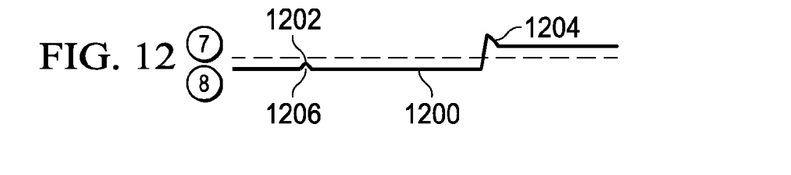
Figure 13:
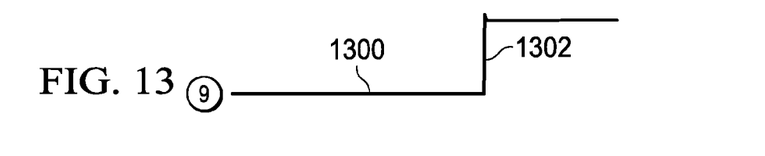

The sampled voltage is shown in FIG. 11 generally as 1100. In order to remove high-frequency noise from the signal, it is passed through a low pass filter, here a fifth order Butterworth low pass filter. The output of the Butterworth low pass filter is shown in FIG. 12 generally as 1200. In order to determine the threshold utilized to extract data or commands from signal stream, RC filter comprising resistor 434 coupled in series between the output of the fifth order Butterworth low pass filter and the non-inverting input of auto zero comparator 438 and a capacitor 436 coupled from the non-inverting input of amplifier 438 to ground is utilized. The threshold 1202 generated by the low pass filter 434, 436 is utilized to extract the data which appears that the output of the auto zero comparator 438. The signal 1206 represents a digital zero and the signal 1204 represents a digital one. The signal 1300 is the output of auto-zero comparator 438, with a digital one output being shown at 1302.

Figure 5:
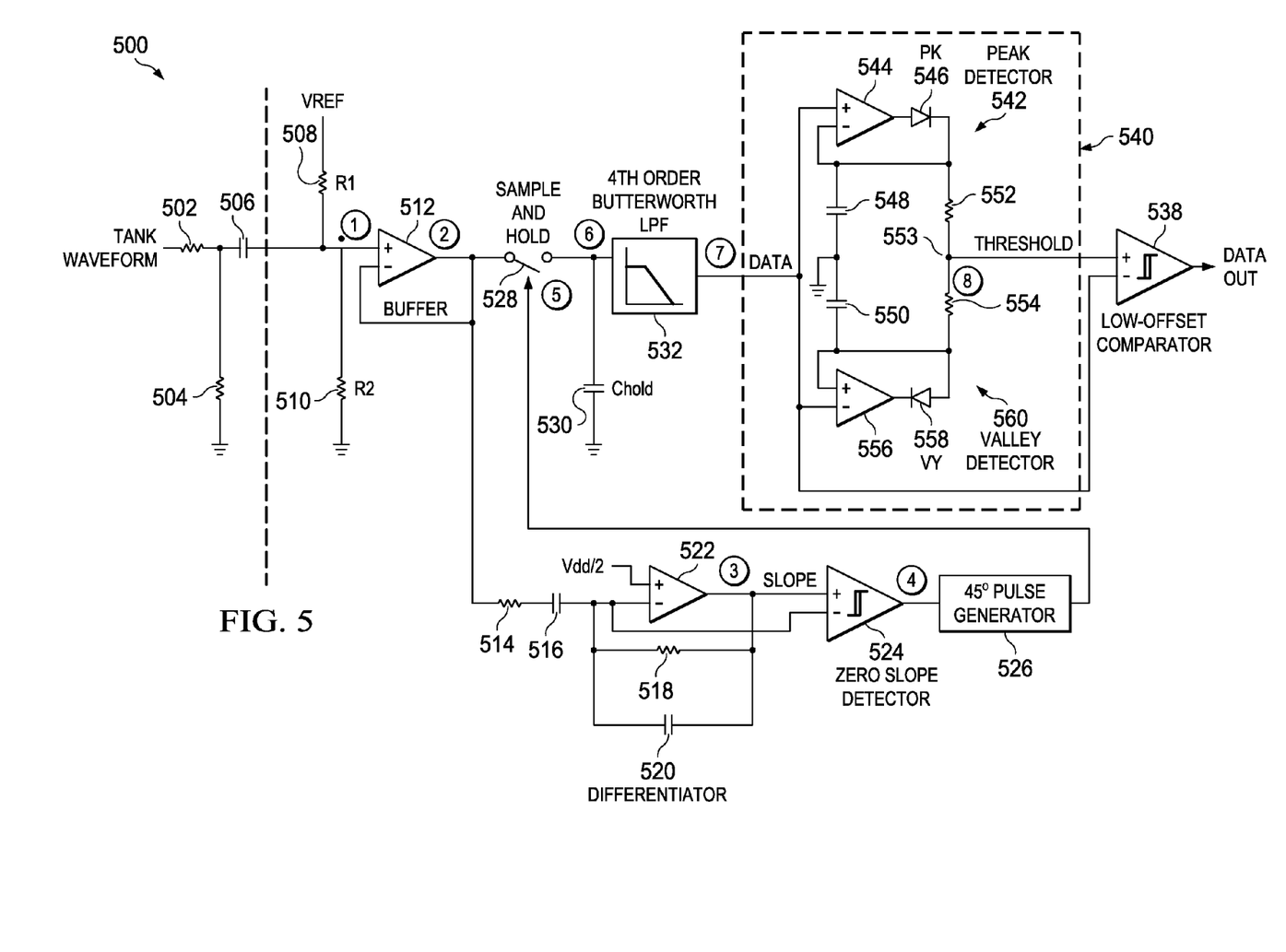
FIG. 5 shows an alternate embodiment constructed according to the principles of the present disclosure; \

FIG. 5 shows an alternative embodiment of a solution to this problem generally as 500. In FIG. 5, the tank waveform from the transmitter side tank circuit is coupled via resistor divider 502, 504 to a capacitor 506. The resistor divider 502, 504 divides the voltage across the tank circuit, which may be as much as 70 V peak to peak, to a level that can be handled by an integrated circuit. Capacitor 506 blocks the DC level of the input waveform from affecting the setpoint of a buffer circuit 512, the non-inverting input of which is coupled to the capacitor 506. This allows the setpoint of the buffer 512 to be set via the resistor divider 508, 510 between a reference voltage and ground. The inventors have found it to be advantageous to utilize the voltage just slightly above 0 V, for example, 100 or 200 mV as the setpoint for the buffer 512. In addition, this circuit is operated at a higher voltage than may be used for other portions of the transmitter circuit, for example 4 V rather than 3.3 V. The combination of these two features allows for an increased voltage swing of the measured data or commands in the signal stream. Buffer 512 has its output coupled to the inverting input thereof so that it has again of unity. The output buffer 512 is coupled to a differentiator circuit 514, 516, 518, 520 and 522. The amplifier 522 has its inverting input coupled to the output of the buffer 512 via resistor 514 and coupling capacitor 516, which are coupled in series. The amplifier 522 has its output coupled to its inverting input utilizing the parallel combination of the resistor 518 and capacitor 520. Placing a small value capacitor such as capacitor 520 across the feedback resistor 518 and placing a resistor in series with the input, such as resistor 514, increases the stability of the differentiator circuit. The non-inverting input to amplifier 522 is coupled to half the supply voltage as a reference. The output of amplifier 522 is coupled to the non-inverting input of a zero slope detector 524. The inverting input of slope detector 524 is coupled to the inverting input of amplifier 522. The output of amplifier 524 is coupled to an input of a 45° delayed pulse generator 526, which generates a 45° delay. The output of the 45° delayed pulse generator 526 operates the switch 528 of sample hold circuit 528, 530. A sample value is stored in capacitor 530 which is coupled between the switch and ground.

The voltage across capacitor 530 is filtered by a low pass filter 532. In this embodiment only a fourth order Butterworth low pass filter is required. The output of the low pass filter 532 is connected to a threshold detection circuit 540. This threshold detection circuit 540 utilizes a peak detector circuit 542 and a valley detector circuit 560. Peak detector 542 and valley detector 560 are coupled to receive the output of the fourth order Butterworth filter 532 on the data line. This signal is coupled to the non-inverting input of amplifier 544 in peak detector circuit 542 and to the non-inverting input of amplifier 556 in valley detector circuit 560. The output of amplifier 544 is coupled through diode 546 to the inverting input thereof. A capacitor 548 is coupled between the inverting input of the amplifier 544 and a reference voltage, represented by ground. The output of amplifier 556 is coupled through diode 558 to the inverting input thereof. The inverting input is also coupled via a capacitor 550 to the reference potential represented by ground. A pair of resistors 552 and 554 are coupled in series between the inverting input to the amplifier 544 and inverting input to the amplifier 556. A node 553 is at the junction of the two resistors. Node 553 is coupled to the inverting input of comparator 538, the non-inverting input of which is coupled to receive the data. The recovered data is at the output of the comparator 538. This circuit allows smaller capacitors to be utilized, for example two 100 pF capacitors and two 25 mega ohm resistors. Further detail about the threshold detection circuit 540 can be found in commonly-owned application Ser. No. 14/501,850 filed on even date and incorporated herein by reference in its entirety for all purposes.

FIG. 12 shows the threshold signal at the input of comparator 538 as 1202 and shows the data signal at the output 1200 of a fourth order Butterworth low pass filter 532 having a digital zero at 1206 a digital one at 1204. FIG. 13 shows the output of the current threshold detector circuit at 1300, a digital one being shown at 1302.

Figure 14:
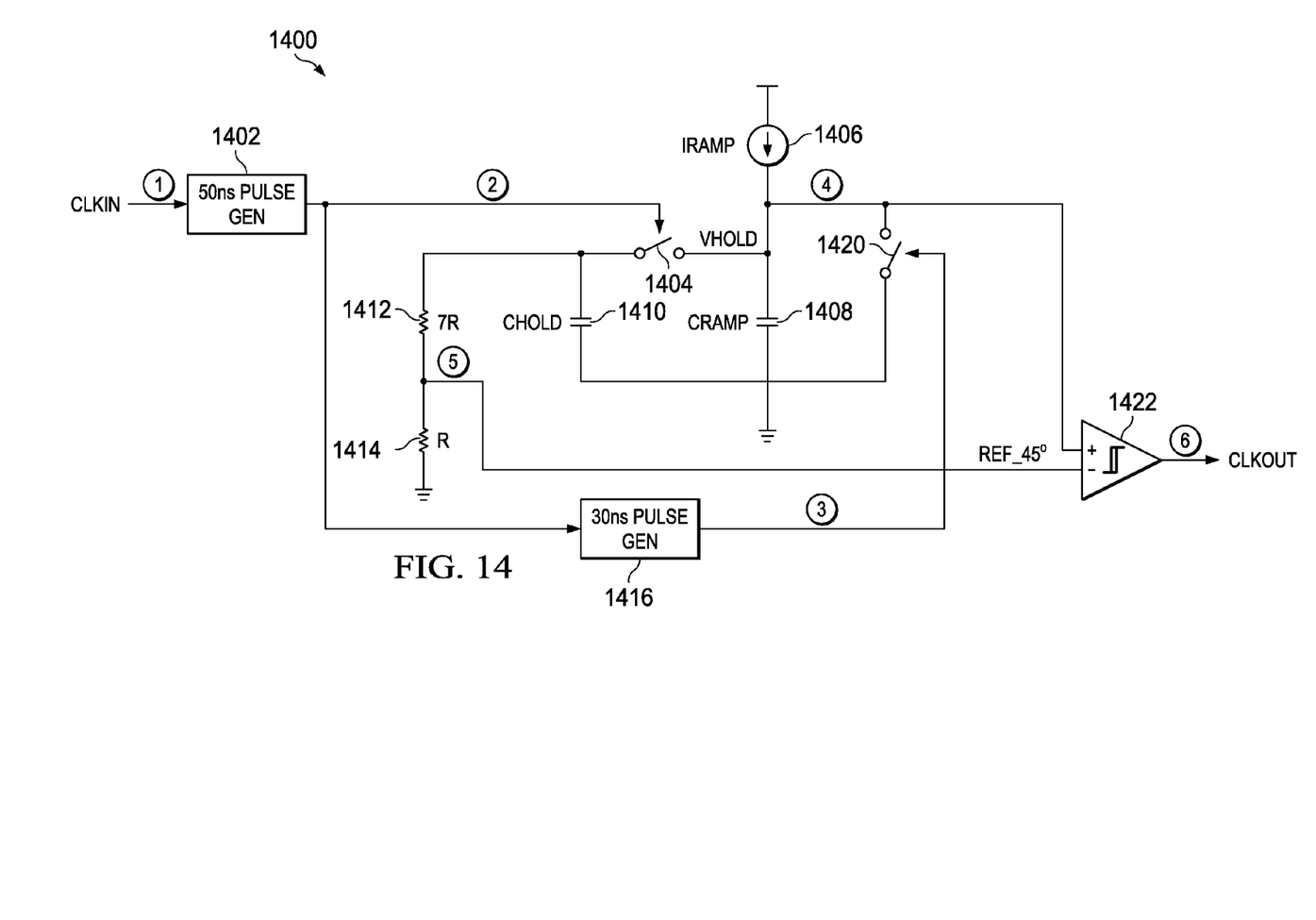
FIG. 14 is a block diagram of a circuit for generating a 45° phase delayed clock.
Figure 15:
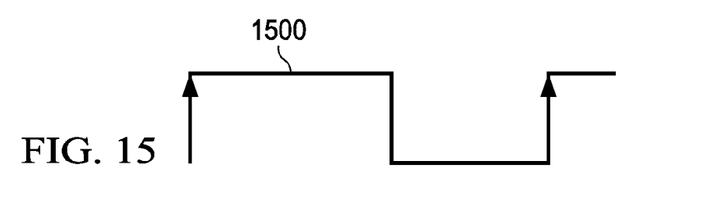
FIGS. 15-20 show waveforms for the circuit illustrated in FIG. 14.
Figure 16:
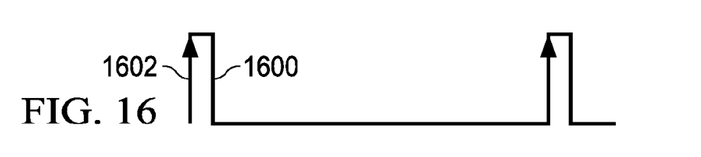
Figure 17:
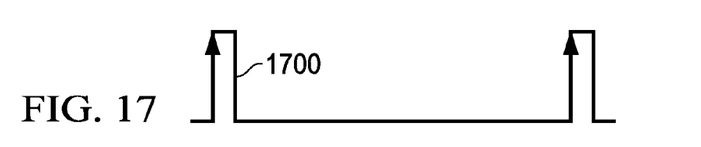
Figure 18:
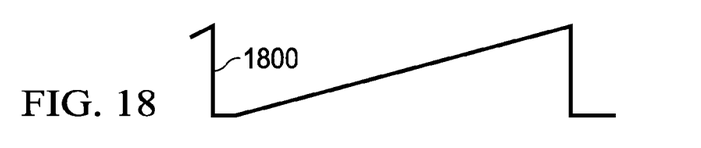
Figure 19:
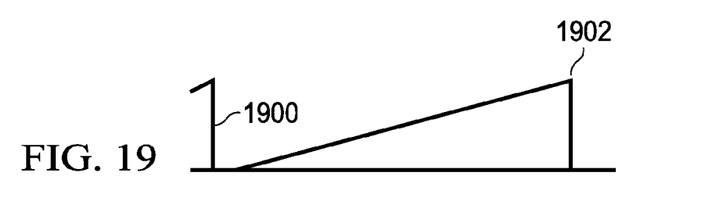
Figure 20:
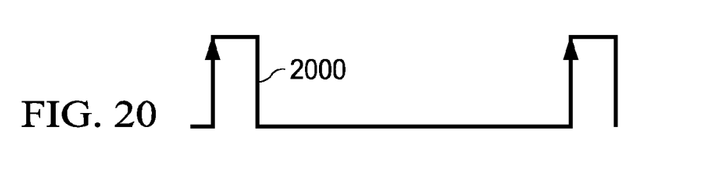

A circuit for the generation of the phase shift, such as the 45° phase shift of blocks 426 and 526, is shown in FIG. 14, generally as 1400. The clock signal, such as the output of zero slope detector 424, 524 and illustrated in FIG. 15, is applied to the input of a 50 ns pulse generator 1402. The output of pulse generator 1402 is coupled to operate a switch 1404 which samples the voltage across capacitor Cramp 1408 in capacitor hold 1410. The capacitor 1408 is charged by a constant current source 1406. The voltage across the sample and hold capacitor 1410 is divided by resistor divider 1412, 1414, between the switch 1404 and ground. The signal across the capacitor 1408 is shown in FIG. 18, generally as 1800. The output of the resistor divider is shown in FIG. 19 generally in 1900. The output of the 50 ns pulse generator 1402 is also coupled to an input of a 30 ns pulse generator 1416. The pulse generator 1402 can generate a pulse in the range of 20-70 ns and the pulse generator 1416 can generate a pulse in the range of 10-40 ne, for example. The output of pulse generator 1416 is shown in FIG. 17, generally as 1700. This signal is used to operate switch 1420 which discharges the capacitor, thus generating the ramp signal shown in FIG. 18 as 1800. The voltage of the output voltage divider 1412, 1414 is coupled to the non-inverting input of comparator 1422 the inverting input of which is coupled to the voltage across the capacitor 1408. The output signal, shown in FIG. 20, as 2000, is delayed from the input signal by an amount determined by the ratio of resistor 1412, 1414. In this case, the value of resistor 1412 is seven times the value of the resistor 1414, thereby yielding a 45° phase shift (one eighth of 360 degrees).

The 45° phase delayed pulse generators 426, 526 shown in FIGS. 4 and 5, respectively, can be replaced with fixed time delay circuits. The fixed time delay could be 250 ns to 1.2 µs, for example. The pulse generated by the time delay circuits may be 300 ns wide, for example. These circuits are somewhat simpler in construction than a phase delayed pulse generator circuit. Circuits capable of generating such time delayed pulses are well known in the art and need not be discussed further herein.

Although the invention has been described in detail, it should be understood that various changes, substitutions and alterations can be made thereto without departing from the spirit and scope of the invention as defined by the appended claims.

The invention claimed is:

1. In a primary side wireless power transmitter for being inductively coupled to a secondary side wireless power receiver for supplying power to the wireless power receiver to power a load coupled to the wireless power receiver, a primary side control for receiving communications from the secondary side wireless power receiver through the inductive coupling, comprising:
    a primary side tank circuit receiving a signal stream on from the secondary side wireless power receiver;
    a delay circuit generating a fixed phase delay clock signal from a tank circuit signal;
    a sample and hold circuit sampling the tank circuit signal utilizing the fixed delayed clock signal; and
    a comparator coupled to an output of the sample and hold circuit for extracting data or commands from the signal stream.

2. The controller of claim 1 wherein the delay circuit is a phase delay circuit generates a clock signal which has a phase delay of between 15° and 75° with respect to a tank circuit voltage.

3. The controller of claim 2 further comprising a buffer circuit coupled between the tank circuit and the sample and hold circuit, the buffer circuit being biased at a DC level near zero volts to increase amplitude of a half sine wave signal at an output thereof.

4. The controller of claim 3 wherein the bias point is substantially 200 mV.

5. The controller of claim 2 further comprising a buffer circuit coupled between the tank circuit and the sample and hold circuit, the buffer circuit being an open loop buffer circuit.

6. The controller of claim 1 further comprising a differentiator circuit coupled to the tank circuit for generating a signal related to the slope of the tank circuit voltage.

7. The controller of claim 6 wherein an input signal to the differentiator circuit is a sine wave signal and output thereof is a cosine wave signal.

8. The controller of claim 7 further comprising a zero slope detector coupled between the output of the differentiator circuit in the phase delay circuit.

9. The controller of claim 8 wherein the zero slope detector detects a zero crossing of the cosine wave signal to detect a peak of the tank circuit voltage.

10. The controller of claim 9 wherein the output of the sample and hold circuit is filtered by a low pass filter.

11. The controller of claim 10 rendered output of the low pass filter is compared with an average value of the output of the low pass filter to detect data or commands from the secondary side power receiver.

12. The controller of claim 10 wherein an output of the low pass filter is compared with an output of threshold generating circuit comprising a peak detector circuit and a valley detector circuit and output of the peak detector circuit and output of the valley detector circuit being coupled to an input of a comparator, the other input of which receives the output of the low pass filter.

13. The controller of claim 10 wherein the delay circuit is a phase delay circuit comprising a constant current source; a first capacitor charged by the constant current source; a sampling circuit controlled by a clock sampling the voltage across the first capacitor and storing a value of the voltage on a second capacitor; a resistor divider dividing the voltage across the second capacitor; and a comparator receiving the voltage across the first capacitor and the voltage across the second capacitor to generate a delayed clock signal.

14. A method of operating a primary side wireless transmitter inductively coupled to a secondary side wireless power receiver for supplying power to the wireless power receiver to power a load coupled to the receiver comprising:
    receiving a signal stream from the wireless power receiver in a primary side tank circuit;
    generating a fixed delayed clock signal;
    sampling the tank circuit voltage signal utilizing the fixed phase delayed clock and holding the sampled value;
    generating a threshold voltage signal from the signal stream signal; and
    extracting data from the signal stream utilizing the threshold voltage signal.

15. The method of claim 14 wherein the fixed delay is a phase delayed clock is generated at a fixed delay of between 15° and 75°.

16. The method of claim 15 further comprising differentiating a signal representative of tank circuit voltage for generating a signal related to slope of the tank circuit voltage.

17. The method of claim 16 wherein an input signal to the differentiator circuit is a sine wave signal and an output thereof is a cosine wave signal.

18. The method of claim 17 for the comprising zero slope detecting output of the differentiator circuit.

19. The method of claim 18 wherein zero slope detecting comprises detecting a zero crossing of the cosine wave signal.

20. The method of claim 19 further comprising low pass filtering the output of the sample and hold circuit.

21. The method of claim 20 further comprising comparing output of the low pass filter with an average value of the output of the low pass filter to detect data or commands from the secondary side receiver.

22. The method of claim 20 further comprising comparing an output of the low pass filter with an output of a threshold generating circuit comprising a peak detector circuit and a valley detector circuit, and output of the peak detector circuit being coupled to the input of a comparator which also receives the output of the low pass filter.

23. The method of claim 14 wherein generating a fixed phase delayed clock signal comprises generating a fixed phase delayed clock signal by charging a first comparator with a constant current source; utilizing the clock to control sampling voltage across the first capacitor during a value of the voltage and a second capacitor; dividing the voltage across the second capacitor; and receiving the voltage across the first capacitor and a voltage across the second capacitor in a comparator to generate the delayed clock signal.

24. A wireless power transfer system comprising:
a transmitter for transmitting electrical energy through a first conductive coil electromagnetically coupled the second conductive coil and a receiver;
a circuit in the receiver generating signals which can be recognized in the second inductive coil to generate data or command signals in the first conductive coil;
a sample and hold circuit sampling a value of a signal in the first conductive coil and holding the value, the sample being taken at a fixed delay from the signal in the first inductive coil; and
a comparator coupled to an output of the sample and hold circuit for extracting data or commands from a signal stream.

* * * * *